United States Patent [19]

Haas et al.

[11] Patent Number: 5,076,885
[45] Date of Patent: Dec. 31, 1991

[54] PROCESS FOR ETCHING WORKPIECES

[75] Inventors: Rainer Haas, Herrenberg; Albert Caruana, Rödermark, both of Fed. Rep. of Germany

[73] Assignees: Hans Hollmuller Maschinenbau GmbH & Co., Herrenberg; Du Pont de Nemours (Deutschland) GmbH & Co., Bad-Homburg, both of Fed. Rep. of Germany

[21] Appl. No.: 466,449
[22] PCT Filed: Sep. 18, 1989
[86] PCT No.: PCT/EP89/01078
§ 371 Date: Jul. 10, 1990
§ 102(e) Date: Jul. 10, 1990
[87] PCT Pub. No.: WO90/03454
PCT Pub. Date: Apr. 5, 1990

[30] Foreign Application Priority Data
Sep. 30, 1988 [DE] Fed. Rep. of Germany ....... 3833242

[51] Int. Cl.$^5$ ............................. B44C 1/22; C23F 1/02
[52] U.S. Cl. ........................................ 156/642; 134/10; 134/27; 134/103; 156/640; 156/656; 156/659.1; 156/666; 156/345
[58] Field of Search ............... 156/626, 627, 640, 642, 156/656, 659.1, 666, 345; 134/3, 10, 27, 103

[56] References Cited

U.S. PATENT DOCUMENTS 4,058,431 11/1977 Haas ............................... 156/642 X
4,741,798 5/1988 Haas ............................... 156/642 X

FOREIGN PATENT DOCUMENTS

A2322392 11/1974 Fed. Rep. of Germany.
A2278796 2/1976 France.

Primary Examiner—William A. Powell
Attorney, Agent, or Firm—Fred Philpitt

[57] ABSTRACT

Workpieces containing copper, in particular copper laminated printed circuit boards, are etched in an alkaline etching agent which contains a copper tetramine complex as the active component. After etching, the workpieces are washed with a mainly neutral washing liquid consisting of a solution of the salt required for regeneration of the etching agent. This regeneration salt mainly contains ammonia ions and chloride ions. In a regeneration system connected to the etching machine the etching agent is on the one hand set to the correct pH value with ammonia gas and on the other hand diluted with the neutral mixture resulting from the washing process.

15 Claims, 1 Drawing Sheet

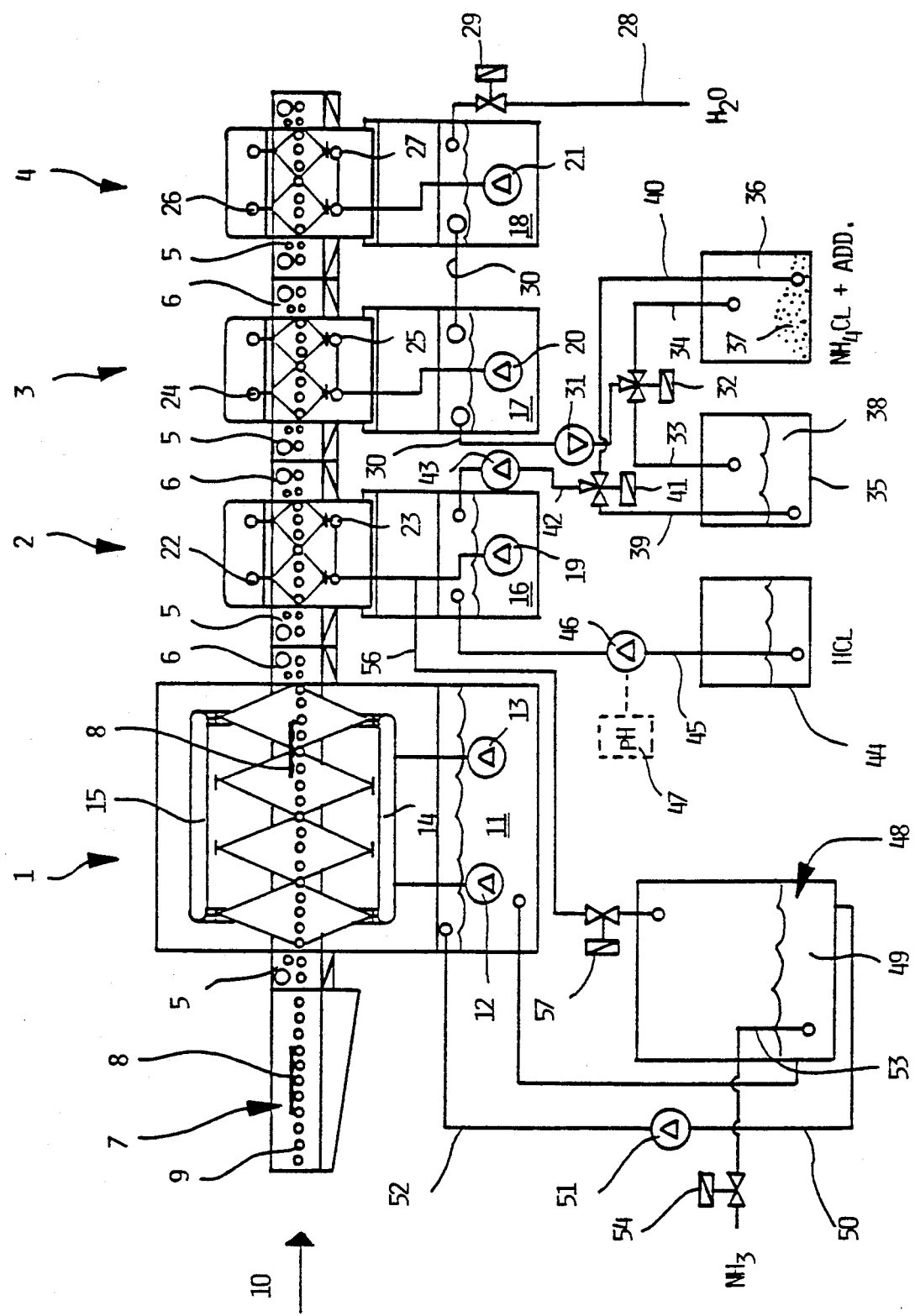

PROCESS FOR ETCHING WORKPIECES

DESCRIPTION

The invention refers to a process for etching workpieces containing copper, in particular copper laminated printed circuit boards, in which a) The workpieces are subjected to a strong alkaline etching agent containing a copper tetramine complex and chloride ions, whereby the effective copper tetramine complex is decomposed to form an ineffective copper diamine complex b) The etching agent is regenerated by the addition of ammonia ions, chloride ions, water and oxygen c) After etching, the workpieces are washed with a washing liquid to remove any remaining etching agent The invention furthermore refers to an etching system for executing this process, with:

a) An etching machine in which workpieces containing copper, in particular copper laminated printed circuit boards, are subjected to a strong alkaline etching agent containing a copper tetramine complex and chloride ions, whereby the effective copper tetramine complex is decomposed to form an ineffective copper diamine complex b) A regeneration system in which the etching agent is prepared for regeneration with oxygen by the addition of ammonia ions, chloride ions and water c) At least one washing device following the etching machine, in which any remaining etching agent is removed from the workpieces by a washing liquid.

Such a process or such an etching system respectively is described in the DE-PS 24 34 305. In this etching system several washing devices are provided in the form of a cascade. They all use water as the washing liquid. This water passes through the various washing devices in the cascade in the direction opposite to the direction of movement of the workpieces, so that the last washing device when viewed in the direction of movement contains the cleanest washing liquid.

In practice the following has become apparent:

During operation of the existing etching system the workpieces processed in the etching machine carry the etching agent, which contains a relatively high concentration of copper ions, into the first washing device in the washing cascade. If this first washing device was operated in the neutral area then the copper located in the area containing the etching agent would be precipitated as copper hydroxide and would collect as sludge in the sump of the first washing device. This would lead to incorrect operation both of the pumps and the jets in this washing device.

In the existing etching system it is also necessary to maintain the washing liquid in the first washing device at a strong alkaline level, at a pH value close to 10, through the addition of ammonia. Under these conditions no copper hydroxide is precipitated from the etching agent carried into the washing device. However, it is then no longer possible to process workpieces in this etching system in cases where a material which is released by alkaline solutions is used as the etching resist. Such etching resist materials which are removed by alkaline solutions would be released from the substrate in the washing device.

The objective of the invention involved here is to provide a process of the type stated at the outset in which also those workpieces can be treated which are coated with an etching resist which is soluble in an alkaline solution.

This task is solved by the invention in that:

d) Directly after the etching process the workpieces are washed with a mainly neutral solution of a regeneration salt containing the necessary ammonia ions and chloride ions e) After use, the initial solution is added as a washing liquid for regenerating the etching agent, whereby ammonia is also added for adjusting the pH value.

The invention is based upon the fact that a neutral washing liquid can be used without the risk of precipitation of copper hydroxide if this solution is a neutral solution of the regeneration salt. Apparently this allows the high concentration of salt in the initial solution. The initial solution is thus used twice—once as the washing liquid for the washing process directly following the etching process and once in its actual function for regenerating the etching agent.

The workpieces washed in a neutral initial solution according to the invention can then be treated with water as the washing liquid, again without the risk of precipitation of copper hydroxide. In this case it is recommended that the water used for producing the initial solution is first used as the washing water in a washing process which follows the first washing process with the initial solution. The "waste water" from the subsequent washes with water is therefore disposed of by being used in the preparation of the initial solution.

It is ideal if the pH value of the initial solution used for washing is set by the addition of an acid. In such cases hydrochloric or acetic acid is preferred. In this way one can accommodate the fact that the workpieces continuously carry alkaline etching agent into the washing liquid. Without the addition of acid the pH value of the initial solution serving as the washing liquid could increase undesirably.

The task of this invention is furthermore to design an etching system of the type stated at the outset so that workpieces coated with an alkali-soluble etching resist can also be processed.

This task is solved according to the invention by the fact that:

d) The washing solution used in the first wash directly following the etching machine is mainly a neutral solution of a regeneration salt which contains the ammonia ions and chloride ions required.

e) The first washing device is connected to the regeneration system so that part of the initial solution used as the washing liquid can be fed to the regeneration system.

In one design of the invention there is a storage tank for hydrochloric acid from which the acid can be fed by a pump to the initial solution in the first washing device.

A pH test device can be provided which monitors the pH value of the initial solution in the first washing device and controls the pump so that the pH value of the solution in the first washing device is largely maintained at a constant level.

Naturally the initial solution must in turn be washed off the treated workpieces. Further washing devices using water as the washing liquid are provided for this purpose. According to one design of the invention the washing devices using water as the washing liquid follow the first washing device using a neutral solution as the washing liquid, whereby the waste water of the washing devices using water as the washing liquid is fed to a mixing tank where it is added to solid regeneration salt to prepare the mainly neutral initial solution. In this way no separate disposal of the waste water resulting from the washing devices using water is required.

Thus two mixing tanks can be provided which operate alternately, whereby one is connected to the washing devices using water as the washing liquid and serves for preparation of the initial solution and the other is connected to the first washing device using the initial solution as the washing liquid and serves as a storage tank for the initial solution. This design of the invention allows quasi-continuous operation.

One design example of the invention is described in more detail in the following section, with the aid of the drawing. This single drawing shows the schematic diagram of an etching system.

The drawing shows an etching system which is arranged in conventional modular design. It includes an etching module (1) as well as three consecutive washing modules (2, 3 and 4). The precise layout and construction of the various modules is of subordinate importance here. They are described only as far as is necessary to provide a reasonable understanding of the invention. Reference is made for example to the DE-PS 24 34 305 for further details.

All modules (1 to 4) are provided with an infeed zone (5) and an outfeed zone (6) in which pairs of squeezing rollers are provided which largely prevent any transfer of the process liquid into the subsequent processing station.

The infeed zone (5) of the etching module (1) has an input station (7) in which the workpieces (8) to be etched can be placed upon a roller conveyor system (9). The roller conveyor system (9) moves the workpieces (8) continuously through the complete system in the sense of the arrow (10).

In the lower area of the etching module (1) there is a sump (11) in which etching agent collects. The pumps (12 and 13) transport the etching agent to the nozzles (13 and 14) above and below the path of the workpieces (8). These are sprayed with the etching agent from above and below as they pass through the etching module (1), whereby the etching reaction required takes place. The etching agent then drips back into the sump (11) of the etching module.

The washing modules (2, 3 and 4) are similarly provided with sumps (16, 17 or 18 respectively) in which the relevant washing liquid collects. Furthermore, a pump (19, 20, 21) is allocated to each washing module (2, 3, 4) to apply the washing liquid to the nozzles (24 to 27) above and below the path of the workpieces. The workpieces (8) are thus sprayed with the relevant washing liquids from above and below whilst passing through the washing modules (2, 3 and 4) and are therefore cleaned so that practically no etching agent remains on them by the time they leave the last washing module (4). The relevant washing liquid used in each of the washing modules (2, 3 and 4) drips back into the relevant sumps (16, 17 or 18 respectively).

The workpieces are washed with water in the last two washing modules (3 and 4) in the normal way in the counter-flow process as described in the DE-PS 24 34 305 stated above. The fresh water is fed through a pipe (28) and a solenoid valve (29) into the sump (18) of the last washing module. In practice the washing liquid in the module (4) therefore consists almost exclusively of clean, fresh water which washes off the very last residues of etching agent from the workpieces (8) as they leave the entire system.

The washing module (4) is connected to the previous washing module (3) by an overflow line (30). If a certain quantity of fresh water is fed into the sump (18) of the washing module (4) a corresponding quantity of liquid flows via this overflow line (13) into the sump (17) of the previous washing module (3). This washing module (3) also contains a washing liquid which consists mainly of water but this is slightly more contaminated by the residues of the washing liquid from the washing module (2) and the etching agent from the etching module (1) carried in by the workpieces.

The etching system described so far corresponds mainly to the state of the art in technology as stated in DE PS 24 34 305.

To obtain an understanding of the components of the complete system not yet described one should first remember the chemistry involved in the etching processes used here.

In the etching module (1) an alkaline etching agent is used whose active component is the copper tetramine complex compound. The reaction in the etching module (1) in which metallic copper is dissolved occurs with a reduction of the IV copper in the copper tetramine complex into the II copper in a copper diamine complex. Thus the copper tetramine complex decomposes and the copper diamine complex is constructed.

At the same time the specific density of the etching agent rises due to the enrichment with copper. In this way the etching capacity of the etching agent is reduced, since it loses a proportion of the active components (copper tetramine complex). In order for the etching system nevertheless to be operated continuously with largely constant results the etching agent has to be regenerated. For this, the copper diamine complex is oxidised to produce the copper tetramine complex again by the addition of a compound containing chloride ions and a compound containing ammonia ions with the aid of oxygen which can be taken from the air or an oxidation agent.

The pH value of the etching agent in the etching module (1) is held at a value of between approx. 8 and 10 in order to achieve optimum results.

The etching agent in the etching module (1) therefore contains copper ions in a relatively high concentration, which is important for the following considerations. If this etching agent is carried by the workpieces (8) from the etching module (1) to the first washing module (2) then the following problem results: If more or less pure water in a neutral range is used as the washing agent then the copper contained in the etching agent brought in would be precipitated in the form of copper hydroxide and would collect as sludge in the sump (16) of the first washing module (2). This sludge would affect operation of both the pump (19) and the nozzles (22 and 23).

Precipitation of copper hydroxide in the first washing module (2) must therefore be prevented. In the state of the art in technology this is achieved by keeping the washing liquid in the first washing module (2) at a pH value of approx. 10 through the addition of ammonia in the form of gas, so that no copper hydroxide can form.

This high pH value however prevents the use of certain etching resists, as they would separate at such high pH values.

For this reason the etching system described here uses in the first washing module (2) which follows the etching module (1) a washing agent which is produced in the following manner:

From the penultimate washing module (3) an overflow pipe (30) connected through a pump (31) leads to a 3-way valve (32). This 3-way valve (32) is also connected via the pipes (33 and 34) to two tanks (35 and 36). These two tanks (35 and 36) are operated alternately in the following way:

Regeneration salt (37) is provided in one of the tanks (36). The position of the 3-way valve (32) is such that washing liquid (lightly contaminated water) is taken by the pump (31) from the sump (17) of the second washing module (3) and fed into the tank (36) so that the regeneration salt (37) can be dissolved.

The second tank in each case (35) contains regeneration salt (38) and serves as a storage tank for the washing liquid which can be fed to the washing module (2).

Both the tanks (35 and 36) are connected to a 3-way valve (41) through the pipes (39 or 40 respectively). From the 3-way valve (41) a pipe (42) leads via a pump (43) into the sump (16) of the first washing module (2). The pump (43) can therefore transfer the watery, largely neutral solution (38) of the regeneration salt from either of the containers (36 and 36) into the first washing module (2). The position of the 3-way valve (41) is therefore obviously such that the tank containing the finished liquid regeneration salt solution in each case is connected to the pump (43). In the drawing this is the tank (35).

In addition to the tanks (35 and 36) there is a storage tank (44) which contains hydrochloric acid. A pipe (45) leads to a pump (46) and from there into the sump (16) of the first washing module (2). The pump (46) is electrically controlled by a pH test unit (47) which monitors the pH value of the washing liquid circulating in the washing module (2). Details of the control are given further below.

The regeneration of the etching agent used in the etching module (1) as described above takes place in a regeneration system (48). The etching agent is taken from the sump (11) of the etching module (1) and forwarded to the regeneration system (48) (perhaps controlled by a device which monitors the specific density of the etching agent in the etching module (1)). The etching agent to be regenerated is collected in a mixing chamber (49) in the regeneration system (48). In this mixing chamber (49) regeneration agents are added to the etching agents in a manner described further below. A pipe (50) connects the mixing chamber (49) to a pump (51) which sends the regenerated etching agent back to the sump of the etching module (1) through the pipe (52).

A pipe (53) which can be shut off by a solenoid valve (54) is provided to feed ammonia gas into the mixing chamber (49) of the regeneration system (48).

The etching system described here operates as follows:

The workpieces (8) placed on the roller conveyor system (9) at the infeed station (7) pass along the roller conveyor system (9) into the etching module (1) where they are sprayed with etching agent on both sides through the nozzles (14 and 15). This etches off the copper metal which is not covered by the etching resist, in the normal manner.

The etching agent in the sump (11) of the etching module (1) enriched with copper and its specific gravity rises. In a controlled process which in itself is already well known, some of the etching agent is taken from the sump (11) of the etching module (1) and is added to the mixing chamber (49) of the regeneration system (48).

The etching agent is set to the required specific gravity by controlled addition of the neutral liquid mixture (38) of the regeneration salt which is located in a storage tank (55) in the regeneration system (48), so that the etching agent can be regenerated together with the oxygen applied. The pH value required for correct etching in the etching module (1) is set by the controlled infeed of ammonia gas via the pipe (53) into the mixing chamber (49) of the regeneration system (48).

The workpieces (8) leaving the etching module (1) are roughly cleaned of any residue of etching agent through the pairs of squeezing rollers located in the outfeed zone (6) of the etching module (1) and at the infeed zone (5) of the first washing module (2). Nevertheless, a certain amount of etching agent is carried by the workpieces (8) into the first washing zone (2).

In the first washing zone (2) the workpieces (8) are sprayed with a washing liquid which, as stated above, consists of a mainly neutral solution (38) of the regeneration salt (37). Although this washing liquid is practically neutral, no copper hydroxide is precipitated from the etching agent carried forward. This is because of the high salt content in the washing liquid used in the washing module (2).

The regeneration system (48) is filled automatically, if required, from the washing liquid circulating in the washing module (2), through a branch line (56) which can be shut down by a solenoid valve (57).

The etching agent carried forward by the workpieces (8) from the etching module (1) to the first washing module (2) is highly alkaline, as already stated. For this reason the pH value of the washing liquid in the washing module (2) would in time also be reduced unless an appropriate quantity of hydrochloric acid were added from the storage tank (44) by means of the pump (46). This supply is provided automatically with the aid of the pH test unit which monitors the pH value of the washing liquid in the first washing module (2).

The workpieces (8) leaving the first washing module (2) have thus been cleaned of the etching agent containing copper, to the extent that, after passing through the squeezing rollers in the outfeed zone (6) of the washing module (2) and the infeed zone (5) of the washing module (3), they can be subjected to a washing liquid which is practically free of salt and is neutral, without the risk of precipitation of copper hydroxide. The washing processes in the washing modules (3 and 4) can therefore take place in the conventional manner as described, for example, in DE-PS 24 34 305. The number of washing modules using water as the washing liquid and connected consecutively in the form of a cascade can, of course, be increased if required.

The two tanks (35 and 36) are operated alternately, as already stated above. This means that one of the two tanks (35 and 36) is always connected via the 3-way valve (32) to the pump (31) and, through this, to the sump of the first washing module (3) (viewed in the direction of movement (10)) which uses water as the washing liquid. The overflow water from this first washing module (3) in the water washing cascade is therefore used to dissolve the initially solid regeneration salt (37) and thus to produce the mainly neutral solution (38). Waste water occurs just as little in the water washing cascade (3, 4) as in the object of the DE-PS 24 34 305.

The second of the two tanks (35, 36) (in the drawing of the tank 35) already contains a useable solution (38) which is not, however, fed directly into the regeneration system (48) but is used initially in the first washing module as a mainly neutral washing solution. Only after this "intermediate function" is the solution (38) of the regeneration salt (37) filled into the storage tank (55) of the regeneration system (48) from which it is then fed into the mixing chamber (49) of the regeneration system (48)—to fulfil its "true" function of regeneration.

The system described above possesses all the advantages also inherent to the etching system described in DE-PS 24 34 305. In particular no waste water which must be disposed of separately is produced in the various washing modules (2, 3 and 4) of the cascade. In contrast to the etching system according to DE-PS 24 34 305, however, also alkali-soluble etching resists can be used on the workpieces (8) because the pH value in the first washing module (2) following the etching module (1) need not be raised to a high pH value in order to avoid the precipitation of copper hydroxide.

We claim:

1. A process for etching workpieces containing copper, and in particular copper laminated circuit boards which comprises
   (a) subjecting the workpieces to a strongly alkaline etching agent containing a copper tetramine complex and chloride ions whereby the effective copper tetramine complex is decomposed to form an ineffective copper diamine complex,
   (b) regenerating the etching agent by the addition of ammonia ions, chloride ions, water and oxygen, and
   (c) after etching removing any remaining etching agent by washing with a washing liquid,
   characterized in that
   (d) directly after the etching process the workpieces (8) are washed in a neutral solution (38) of a regeneration salt (37) which contains the required ammonia ions and chloride ions, and
   (e) after use as a washing liquid the neutral solution (38) is added for the regeneration of the etching agent, whereby ammonia is also added for adjusting the pH value.

2. A process according to claim 1 characterized in that the water used to produce the neutral solution (38) was previously used as the washing water in a washing process which precedes the first washing process with the neutral solution (38).

3. A process according to claim 1 characterized in that the pH value of the neutral solution (38) used for washing is adjusted by the addition of an acid.

4. A process according to claim 2 characterized in that the pH value of the neutral solution (38) used for washing is adjusted by the addition of an acid.

5. Process according to claim 3 characterized in that the acid is hydrochloric acid.

6. Process according to claim 3 characterized in that the acid is acetic acid.

7. Process according to claim 4 characterized in that the acid is hydrochloric acid.

8. Process according to claim 4 characterized in that the acid is acetic acid.

9. An etching system which includes
   (a) an etching machine in which workpieces containing copper, and in particular copper laminated printed circuit boards, are subjected to a strongly alkaline etching agent which contains a copper tetramine complex and chloride ions, whereby the effective copper tetramine complex is decomposed to form an ineffective copper diamine complex,
   (b) a regeneration system in which the etching agent is prepared for regeneration with oxygen by the addition of ammonia ions, chloride ions and water, and
   (c) at least a first washing device which follows the etching machine to remove any remaining etching agent from the workpieces by a washing process, characterized in that
   (d) the washing liquid in the first washing device (2) directly following the etching machine (1) is a neutral solution (38) of a regeneration salt (37) containing the necessary ammonia and chloride ions, and
   (e) the first washing device (2) is connected to the regeneration system (48) so that part of the neutral solution (38) used as the washing liquid can be fed into the regeneration system (48).

10. An etching system according to claim 9 characterized in that a storage tank (44) is provided for an acid and from which acid can be metered via a pump (46) into the neutral solution (38) in the first washing device (2).

11. An etching system according to claim 10 characterized in that a pH test device (46) is provided which monitors the pH value in the neutral solution (38) in the first washing device (2) and drives the pump (46) so that the pH value of the neutral solution (38) in the first washing device (2) is largely maintained at a constant level.

12. An etching system according to claim 9 which the workpieces are fed through at least one washing device in which they are treated with water as the washing liquid, characterized in that the washing devices (3, 4) operating with water as the washing liquid follow the first washing device (2) which operates with the neutral solution (38) and that the water leaving the washing devices using water as the washing liquid (3, 4) is fed to a tank (35, 36) where it is added to solid regeneration salt (37) to produce the neutral initial solution (38).

13. An etching system according to claim 10 in which the workpieces are fed through at least one washing device in which they are treated with water as the washing liquid, characterized in that the washing devices (3, 4) operating with water as the washing liquid follow the first washing device (2) which operates with the neutral solution (38) and that the water leaving the washing devices using water as the washing liquid (3, 4) is fed to a tank (35, 36) where it is added to solid regeneration salt (37) to produce the neutral initial solution (38).

14. An etching system according to claim 11 in which the workpieces are fed through at least one washing device in which they are treated with water as the washing liquid, characterized in that the washing devices (3, 4) operating with water as the washing liquid follow the first washing device (2) which operates with the neutral solution (38) and that the water leaving the washing devices using water as the washing liquid (3, 4) is fed to a tank (35, 36) where it is added to solid regeneration salt (37) to produce the neutral initial solution (38).

15. An etching system according to claim 11 characterized in that there are two tanks (35, 36) used alternately, whereby one (36) is connected to the washing units using water as the washing liquid (3, 4) and serves for the preparation of the initial solution 938) while the other (35) is connected to the first washing device (2) which uses the initial solution (38) as the washing liquid and serves as a storage tank for the neutral (38).

* * * * *